United States Patent
Heid

(10) Patent No.: US 6,844,733 B2
(45) Date of Patent: Jan. 18, 2005

(54) MAGNETIC RESONANCE APPARATUS WITH COMPENSATION OF FIELDS ARISING DUE TO EDDY CURRENTS

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/768,913

(22) Filed: Jan. 30, 2004

(65) Prior Publication Data
US 2004/0183535 A1 Sep. 23, 2004

(30) Foreign Application Priority Data

Feb. 3, 2003 (DE) .......................................... 103 04 249

(51) Int. Cl.[7] .................................................. G01V 3/00
(52) U.S. Cl. ...................................... 324/318; 324/322
(58) Field of Search ................................. 324/318, 322, 324/320, 321, 312, 314, 306, 309, 300

(56) References Cited

U.S. PATENT DOCUMENTS

| 4,965,521 A | * 10/1990 | Egloff .......................... 324/312 |
| 5,235,281 A | * 8/1993 | Haragashira et al. ....... 324/318 |
| 5,442,290 A | * 8/1995 | Crooks ........................ 324/309 |
| 6,025,715 A | * 2/2000 | King et al. .................. 324/309 |
| 6,154,030 A | 11/2000 | Wurl |
| 6,236,208 B1 | 5/2001 | Ham et al. |
| 6,335,620 B1 | 1/2002 | Weissenberger |
| 6,456,076 B1 | * 9/2002 | Joseph ........................ 324/318 |
| 6,531,870 B2 | 3/2003 | Heid et al. |
| 6,696,836 B2 | 2/2004 | Kimmlingen |
| 2002/0171424 A1 | 11/2002 | Morich et al. |

FOREIGN PATENT DOCUMENTS

| DE | 34 11 222 | 10/1985 |
| EP | 0 307 516 | 3/1989 |
| GB | 2 180 943 | 4/1987 |

* cited by examiner

Primary Examiner—Louis Arana
(74) Attorney, Agent, or Firm—Schiff Hardin LLP

(57) ABSTRACT

A magnetic resonance apparatus has a magnetic resonance scanner that includes a gradient coil for generating a gradient field, the scanner also has an electrically conductive structure that at least partially envelops the gradient coil, this structure, triggered by a change in the current in the gradient coil, generating an eddy current field having at least one component that compensates for at least one non-linear component of the gradient field within the imaging volume of the scanner, and further has a compensation coil connected in series with the gradient coil and disposed between the gradient coil and the electrically conductive structure, the compensation coil generating a magnetic field that, within the imaging volume, has no linear component and compensates at least for the non-linear component of the gradient field.

10 Claims, 1 Drawing Sheet

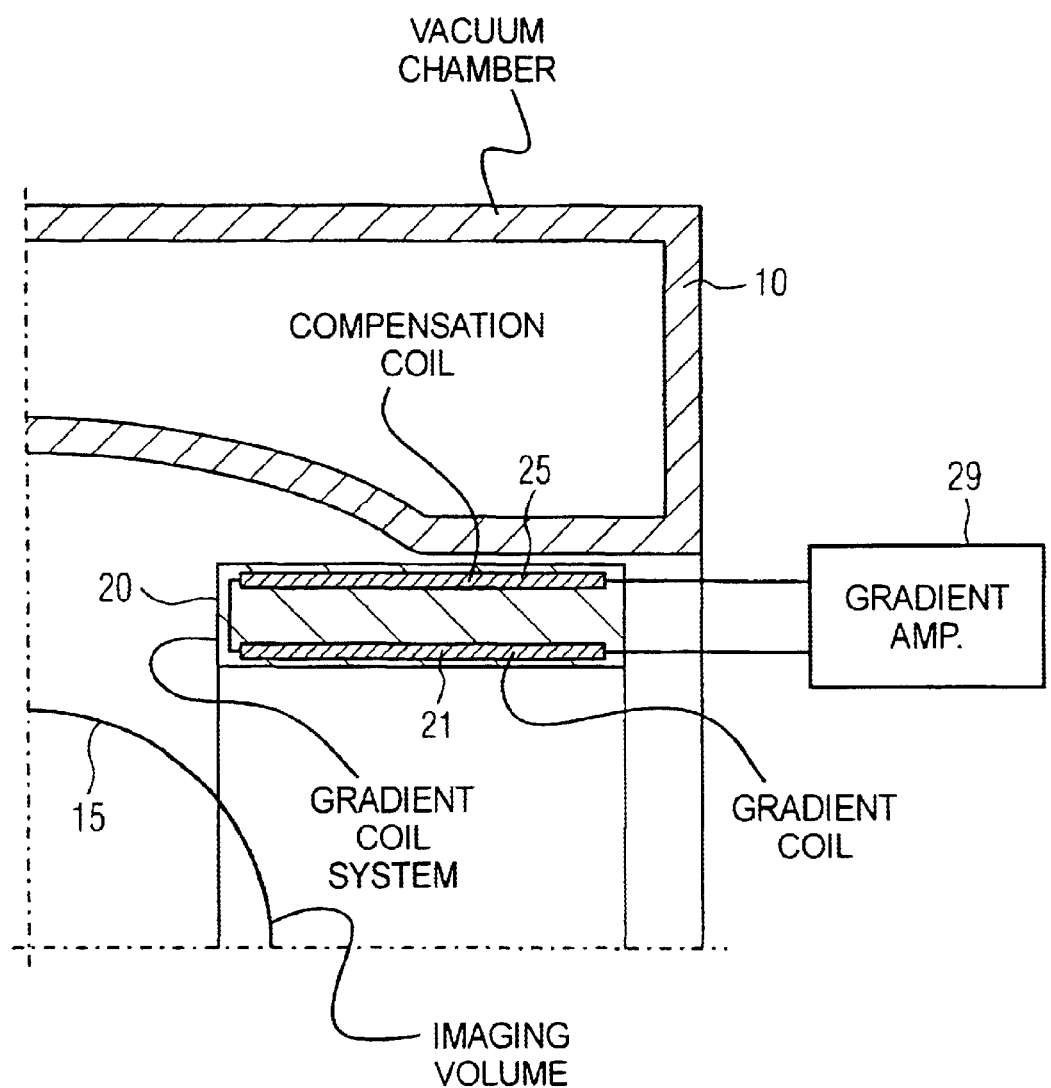

MAGNETIC RESONANCE APPARATUS WITH COMPENSATION OF FIELDS ARISING DUE TO EDDY CURRENTS

BACKGROUND OF THE INVENTION

1. Field of the Invention

The present invention concerns a magnetic resonance apparatus with a gradient coil and an electrically conductive structure that interacts with the gradient field generated by the gradient coil.

2. Description of the Prior Art

Magnetic resonance is a known modality for acquiring images of the interior of an examined object. In a magnetic resonance apparatus rapidly switched gradient fields generated by a gradient coil system are superimposed to a static magnetic field generated by a basic field magnet. Furthermore, the magnetic resonance apparatus includes a radio-frequency system that emits radio-frequency signals into the examined object to generate magnetic resonance signals, and receives the resulting magnetic resonance signals, on the basis of which magnetic resonance images are generated.

In order to generate the gradient fields, electrical currents must be fed into the gradient coils of the gradient coil system. The amplitudes of the required currents can be as large as several hundred amperes. The current rise and fall rates are as large as several hundred kA/s. Since the gradient coil system is usually surrounded by electrically conductive structures, the switched gradient fields induce eddy currents in the gradient coils. Examples of such conductive structures are the vacuum chamber and/or the cold shields of a super-conducting magnet, a radio-frequency shield, made for example of a copper foil, and the antenna of the radio-frequency system. The fields accompanying the eddy currents are undesirable, because, if no counter-measures are taken, they weaken the gradient fields and distort them over time, which negatively affects the quality of the magnetic resonance images.

The distortion of a gradient field caused by eddy current fields can be compensated, to a certain degree, by a corresponding pre-distortion of a parameter that controls the gradient field. To achieve compensation, the controlling parameter must be filtered in such a manner that the eddy current fields that occur during operation of the gradient coil without pre-distortion are cancelled by the pre-distortion. This filtering can be done by a filter network with parameters that are determined by time constants and coefficients that can be ascertained, for example, by a method known from the patent German PS 198 59 501.

Moreover, the use of an actively shielded gradient coil system also can reduce the eddy currents induced by the gradient coil with current therein. Such shielding involves a presettable enveloping surface that extends, for example, through an inner cylinder surface of an 80-K cold shield of the super-conducting magnet. A secondary coil pertaining to the gradient coil usually has a lower number of turns than the relevant gradient coil, and is connected to the gradient coil in such a manner that the same current flows through the secondary coil as through the gradient coil, but in the opposite direction. The secondary coil weakens the gradient field in the volume to be imaged. A gradient coil with a corresponding secondary coil for the reduction of a gradient field on a predetermined enveloping surface is described, for example, in the patent British Specification 2 180 943.

In addition, German OS 34 11 222 describes a magnetic resonance apparatus that includes three gradient coils for the generation of gradient fields and at least one more coil arrangement that operates independently of the gradient coils for the generation of a magnetic field extending in the direction of the main magnetic field. The additional coil arrangement is designed so that the magnetic field changes spatially in a non-linear manner and so that the superposition of the magnetic field with gradient fields results in a defined, temporal and spatial change in the magnetic flux density. In one embodiment, the additional coil arrangement is designed so that the magnetic field has a spatial course corresponding to a spherical function of the second or third order. The additional coil arrangement can especially eliminate the undesirable eddy current effects caused by the gradient fields.

Finally, the patent German OS 101 56 770 discloses a magnetic resonance apparatus with a gradient coil system, in which an electrically conductive structure is arranged and designed so that, at least within the imaging volume of the magnetic resonance apparatus, a magnetic field generated by the electrically conductive structure due to the induction effects of the gradient field is similar (in a generic sense) to the gradient field. In a particular embodiment, at least a part of the structure is designed as a circular surface component of the magnet. This allows, among other advantages, a gradient coil system to be constructed without secondary coils, because the undesirable consequences of the switched gradient fields can be controlled by a pre-distortion due to the similarity of the magnetic field generated by the conductive structure, so that no weakening of the gradient fields occurs due to the secondary coils.

SUMMARY OF THE INVENTION

An object of the present invention is to provide a magnetic resonance apparatus with a simple and compact design that allows compensation of fields that distort the ideal course of the gradient fields.

The above object is achieved in accordance with the principles of the present invention in a magnetic resonance apparatus having a magnetic resonance scanner that includes a gradient coil for generating a gradient field, the scanner also having an electrically conductive structure that at least partially envelops the gradient coil, this structure, triggered by a change in the current in the gradient coil, generating an eddy current field having at least one component that compensates for at least one non-linear component of the gradient field within the imaging volume of the scanner, and further having a compensation coil connected in series with the gradient coil and disposed between the gradient coil and the electrically conductive structure, the compensation coil generating a magnetic field that, within the imaging volume, has no linear component and compensates at least for the non-linear component of the gradient field.

With the decaying of the eddy current field, the compensation coil takes over the compensation; this ensures that a continually good compensation is achieved independently from the course of the gradient field over time. The arrangement of the compensation coil between the gradient coil and the electrically conductive structure, and in particular an arrangement as close to the structure as possible, guarantees that, at the moment of any change in current in the series circuit, the magnetic field of the compensation coil is almost completely compensated in the imaging volume by eddy currents that are generated by the compensation coil in the conductive structure. As the eddy current field caused by the gradient coil dies down, the magnetic field of the compensation coil in the imaging block becomes more and more "magnetically visible" so that the magnetic field of the compensation coil compensates to the extent that the compensation effect of the eddy current field generated by the gradient coil subsides. Since the changes in the eddy current field and in the magnetic field have similar half-time value times as a result of their comparable current flow paths, a sufficient compensation is ensured for the entire duration. The magnetic field of the compensation coil causes to no weakening of the linear component of the gradient field, as is the case with a conventional gradient coil shielded by a secondary coil. This means that the advantages of an increased performance of the non-actively shielded gradient coil system remain. In other words, except for the ohmic losses of the compensation coil, typically formed of only a few wire turns, the inductivity and sensitivity of the gradient coil connected in series therewith remain intact. Due to the series connection, there is no need for an additional, independently controlled voltage source for the compensation coil. There exist well-known methods of determining the conductor configuration of the compensation coil. For example, German OS 197 26 332 discloses a design for the conductor configuration of an electrical coil, in which the current distribution on the surface of a coil is calculated—by means of a minimizing target function allowing boundary conditions—so that the magnetic field generated by the coil can accurately achieve pre-determinable values at pre-determinable locations.

In conformity with the concept of the aforementioned German OS 101 56 770, a gradient coil in conjunction with an electrically conductive structure are designed so that, immediately after a current change in the gradient coil, the magnetic field resulting from the direct magnetic field of the gradient coil and an eddy current field of the conductive structure develops in an imaging volume that, in the ideal case, has the desirable linear distribution of a strictly linear gradient field. However, since the eddy current field dies down, heretofore it has not been possible to maintain this spatial distribution at all times. If, for example, the aforementioned current change is followed by a longer period with a constant current flow in the gradient coil, the eddy current field dies down and magnetic field interference occurs as a result of the gradient coil, because the compensating effect of the conductive structure is no longer or is barely present. Operation in this manner, however, is basic for a gradient coil. In an embodiment of the invention the aforementioned effect is eliminated by using the compensation coil designed according to this invention, while the advantages of the concept according to German OS 101 56 770 remain fully in place. Thus, the advantages of an increased performance of a non-actively shielded gradient coil system, the shielding effect of the electrically conductive structure against magnetic fields interfering from outside, and the possibility to arrange the structure at a greater distance from the gradient coils as secondary coils in an actively shielded gradient coil system, remain fully intact. Finally, the compensation coil can also be used with advantage in a magnetic resonance apparatus that is essentially designed in conformity with German OS 101 56 770, but in which (due to, for example, some limitations in the geometric design), the conductive structure cannot be fully developed.

DESCRIPTION OF THE DRAWING

The single FIGURE is a schematic sectional view of a portion of a magnetic resonance apparatus constructed and operating in accordance with the principles of the present invention.

DESCRIPTION OF THE PREFERRED EMBODIMENTS

The FIGURE shows an exemplary design of the invention—in a longitudinal section of a magnetic resonance apparatus, wherein only the right upper quadrant is illustrated. The magnetic resonance apparatus includes a superconducting magnet for the generation of a maximally homogeneous static magnetic field within an imaging volume 15. The vacuum chamber 10 of the super-conducting magnet is shown in the picture as an electrically conductive structure.

A gradient coil system 20, having two hollow cylinder-shaped halves separated from each other, is disposed in a cavity of the vacuum chamber 10. Each half contains two saddle-shaped coil sections of a first transversal gradient coil 21, two other saddle-shaped coil sections of a second transversal gradient coil, and a solenoidal coil section of a longitudinal gradient coil. For clarity, the FIGURE shows only the first transversal gradient coil 21. For power supply, the gradient coil 21 is connected to a gradient amplifier 29.

For clarity, the FIGURE does not show the RF antenna system, which can be arranged between the two halves of the gradient coil system 20 and that is specially designed for transmitting radio-frequency signals and receiving magnetic resonance signals.

In conformity with the concept of the aforementioned German OS 101 56 770, the gradient coils in conjunction with the vacuum chamber 10 are designed so that, immediately after a current change in, for example, the gradient coil 21, the magnetic field resulting from the gradient magnetic field of the gradient coil 21 and an eddy current field of the vacuum chamber 10 develops in the imaging volume 15 that has the desirable spatial distribution of a strictly linear gradient field. For this purpose, the cavity of the vacuum chamber 10 is distended (bulged), in its middle section, in the shape of a barrel, to allow the implementation of German OS 101 56 770. By means of pre-distortion, an undistorted field is achieved in the imaging volume 15.

If, however, the aforementioned current change is followed, for example, by a longer period with a constant current flow in the gradient coil 21, the eddy current field dies down and magnetic field interference occurs in the imaging volume 15 as a result of the gradient coil 21, because the compensating effect of the conductive structure is no longer present or is barely present. As noted above, however, such operation is the basis for the gradient coil 21. This interference is compensated in accordance with the invention by a suitable compensation coil 25 connected in series with the gradient coil 21. The compensation coil 25 is designed so that the linear field component of the gradient coil 21 remains uninfluenced by the compensation coil 25. In order not to interfere immediately after a current change, the compensation coil 25 is disposed between the vacuum chamber 10 and the gradient coil 21, and in particular it is disposed as close as possible to the vacuum chamber 10, because then, immediately after a current change, the magnetic field of the compensation coil 25 is compensated in the imaging volume as a result of the effect of the eddy currents in the vacuum chamber 10. As the eddy current field caused by the gradient coil 21 dies down, the magnetic field of the compensation coil 25 in the imaging block 15 becomes more and more "magnetically visible" so that the magnetic field of the compensation coil 25 compensates to the extent to which the compensation effect of the eddy current field generated by the gradient coil 21 subsides. The compensation coil 25 is designed so that it can generate a magnetic field that matches the difference in the resulting field of the gradient coil 21 with and without the presence of the electrically conductive structure at a current change.

Compensation coils for the other gradient coils can be arranged in the same plane as the compensation coil 25 of the gradient coil 21. In another embodiment of this invention, the compensation coil is arranged so that it is located even closer along the electrically conductive structure. For that purpose, it can be at least partly non-integrated in the gradient coil system 20. In another embodiment, a differently formed, for example undivided, gradient coil system can be used.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
    a magnetic resonance scanner having an imaging volume, a gradient coil supplied with a changing current to generate a gradient field having at least one non-linear component in said imaging volume, and having an electrically conductive structure that at least partially envelops the gradient coil, said electrically conductive structure generating an eddy current field upon a change in said current in said gradient coil, that has at least one component that compensates said at least one non-linear component of the gradient field in imaging volume; and
    a compensation coil connected in series with said gradient coil and disposed in said scanner between said gradient coil and said electrically conductive structure, said compensation coil generating a magnetic field in said imaging volume having no linear component and that compensates said at least one non-linear component of the gradient field in the imaging volume.

2. A magnetic resonance apparatus as claimed in claim 1 wherein said compensation coil is disposed in said scanner relative to said electrically conductive structure to take over compensation, and after said change in said current in said gradient coil, of said compensation of said at least one non-linear component of said gradient field, to an extent to which said eddy current field decays over time.

3. A magnetic resonance apparatus as claimed in claim 1 wherein said compensation coil is disposed in immediate proximity to said electrically conductive structure.

4. A magnetic resonance apparatus as claimed in claim 1 wherein said gradient coil and said electrically conductive structure have a physical design and are mutually tuned to cause said eddy current field, in said imaging volume, to be geometrically similar to said gradient field.

5. A magnetic resonance apparatus as claimed in claim 1 wherein said scanner comprises a basic field magnet that generates a static magnetic field in said imaging volume, at least a portion of said basic field magnet forming said electrically conductive structure.

6. A magnetic resonance apparatus as claimed in claim 5 wherein said basic field magnet is a superconducting magnet having a vacuum chamber, said vacuum chamber forming said electrically conductive structure.

7. A magnetic resonance apparatus as claimed in claim 6 wherein said vacuum chamber has a barrel shape.

8. A magnetic resonance apparatus as claimed in claim 1 wherein said scanner comprises a gradient coil system having a plurality of gradient coils, including said gradient coil.

9. A magnetic resonance apparatus as claimed in claim 8 wherein at least a portion of said compensation coil is integrated in said gradient coil system.

10. A magnetic resonance apparatus as claimed in claim 8 wherein said gradient coil system has a hollow cylindrical shape.

* * * * *